United States Patent
Harigai et al.

(10) Patent No.: US 8,727,506 B2
(45) Date of Patent: May 20, 2014

(54) INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PEIZOELECTRIC GENERATING ELEMENT

(71) Applicant: Panasonic Corporation, Kadoma (JP)

(72) Inventors: Takakiyo Harigai, Osaka (JP); Yoshiaki Tanaka, Nara (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 13/653,104

(22) Filed: Oct. 16, 2012

(65) Prior Publication Data

US 2013/0038666 A1     Feb. 14, 2013

Related U.S. Application Data

(63) Continuation of application No. PCT/JP2011/004658, filed on Aug. 23, 2011.

(30) Foreign Application Priority Data

Aug. 27, 2010   (JP) .................... 2010-190309

(51) Int. Cl.
*B41J 2/045* (2006.01)
*H01L 41/00* (2013.01)
*B21D 53/76* (2006.01)

(52) U.S. Cl.
USPC .................. 347/68; 310/311; 29/890.1

(58) Field of Classification Search
None
See application file for complete search history.

(56) References Cited

U.S. PATENT DOCUMENTS

| 6,231,779 B1 | 5/2001 | Chiang et al. | |
|---|---|---|---|
| 7,965,021 B2 * | 6/2011 | Harigai et al. | ............... 310/358 |

(Continued)

FOREIGN PATENT DOCUMENTS

| JP | 04-060073 B2 | 9/1992 |
|---|---|---|
| JP | 2001-261435 A | 9/2001 |

(Continued)

OTHER PUBLICATIONS

International Search Report issued in PCT/JP2011/004658 dated Nov. 29, 2011.

*Primary Examiner* — Matthew Luu
*Assistant Examiner* — Erica Lin
(74) *Attorney, Agent, or Firm* — McDermott Will & Emery LLP

(57) ABSTRACT

The purpose of the present invention is to provide an ink jet head capable of ejecting an exact amount of ink, an angular velocity sensor capable of measuring an exact angular velocity, and a piezoelectric generating element capable of generating an electric power due to positive piezoelectric effect, even when the applied electric field of 40 kV/cm or more is applied.

The piezoelectric film used for the present invention comprises a piezoelectric layer and first and second electrodes which sandwich the piezoelectric layer therebetween, the first electrode comprises a (001) orientation, the piezoelectric layer is composed of $(1-z)(Na_xBi_y)TiO_{0.5x+1.5y+2}$-$zBaTiO_3$ having a (001) orientation, x is not less than 0.30 and not more than 0.46, y is not less than 0.51 and not more than 0.62, and z is not less than 0.07 and not more than 0.09.

6 Claims, 11 Drawing Sheets

(56) References Cited

U.S. PATENT DOCUMENTS

| | | |
|---|---|---|
| 2002/0036282 A1 | 3/2002 | Chiang et al. |
| 2004/0139911 A1 | 7/2004 | Chiang et al. |
| 2005/0109263 A9 | 5/2005 | Chiang et al. |
| 2006/0119229 A1 | 6/2006 | Koizumi et al. |
| 2010/0194245 A1 | 8/2010 | Harigai et al. |
| 2010/0289383 A1 | 11/2010 | Harigai et al. |
| 2011/0072900 A1 | 3/2011 | Harigai et al. |
| 2011/0143146 A1 | 6/2011 | Harigai et al. |

FOREIGN PATENT DOCUMENTS

| | | |
|---|---|---|
| JP | 2006-165007 A | 6/2006 |
| JP | 2007-266346 A | 10/2007 |
| JP | 4455678 B1 | 4/2010 |
| WO | WO-2010/047049 A1 | 4/2010 |
| WO | WO-2010/084711 A1 | 7/2010 |
| WO | WO 2010084711 A1 * | 7/2010 |
| WO | WO-2010/122707 A1 | 10/2010 |

* cited by examiner

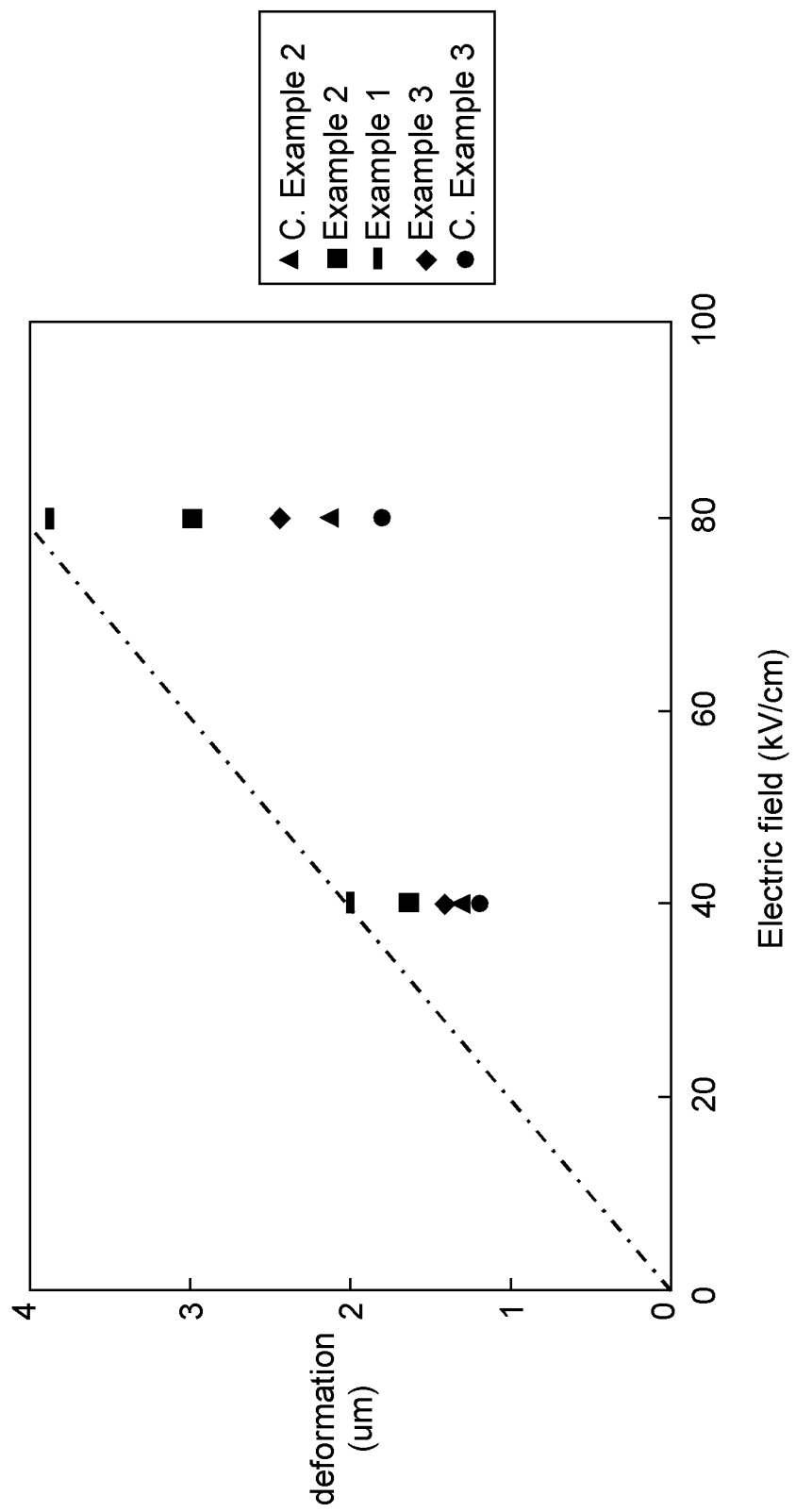

INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PEIZOELECTRIC GENERATING ELEMENT

This is a continuation of International Application No. PCT/JP2011/004658, with an international filing date of Aug. 23, 2011, which claims priority of Japanese Patent Application No. 2010-190309, filed on Aug. 27, 2010, the contents of which are hereby incorporated by reference.

TECHNICAL FIELD

The present invention relates to an ink jet head including the piezoelectric film and a method of forming an image by the head, to an angular velocity sensor including the piezoelectric film and a method of measuring an angular velocity by the sensor, and to a piezoelectric generating element including the piezoelectric film and a method of generating electric power using the element.

BACKGROUND ART

Patent Literature 1 discloses a laminate of a MgO substrate/a Pt electrode/a (Bi,Na,Ba)TiO$_3$ layer.

Patent Literature 2 discloses (Na$_x$Bi$_y$)TiO$_{0.5x+1.5y+2}$—BaTiO$_3$ layers having various compositions of bismuth and sodium. Among them, BNT_08 7 is made of (Na$_x$Bi$_y$)TiO$_{0.5x+1.5y+2}$—BaTiO$_3$ (x=0.29 and y=0.43).

As shown in FIG. 4 of Patent Literature 2, the maximum value of an applied electric field applicable to the BNT_08 7 is 40 kV/cm. The practical maximum value is 10 kV/cm, since an amount of a deformation is not proportional to the applied electric field when the value of the applied electric field is over 10 kV/cm, as shown in FIG. 11. It is difficult to eject an exact amount of ink, to measure an exact angular velocity, and to generate an electric power due to positive piezoelectric effect, when an piezoelectric film where the amount of the deformation is not proportional to the applied electric field is used for an ink jet head, an angular velocity sensor, and a piezoelectric generating element.

On the other hand, a higher applied electric field is required for the ejection of an exact amount of ink, for the measurement of an exact angular velocity, and for the electric power generation due to positive piezoelectric effect.

CITATION LIST

Patent Literature

[Patent Literature 1] Japanese Patent Application Laid-Open Publication No. 2006-165007
[Patent Literature 2] United States Pre-Grant Patent Application Publication No. 2005/0109263

SUMMARY OF INVENTION

The purpose of the present invention is to provide an ink jet head capable of ejecting an exact amount of ink, an angular velocity sensor capable of measuring an exact angular velocity, and a piezoelectric generating element capable of generating an electric power due to positive piezoelectric effect, even when the applied electric field of 40 kV/cm or more is applied.

Another purpose of the present invention is to provide a method for forming an image with use of the ink jet head, to provide a method for measuring an angular velocity with use of the angular velocity sensor, and to provide a method for generating electric power with use of the piezoelectric generating element.

The piezoelectric film used for the present invention comprises a piezoelectric layer and first and second electrodes which sandwich the piezoelectric layer therebetween, and the first electrode comprises a (001) orientation, the piezoelectric layer is composed of (1-z)(Na$_x$Bi$_y$)TiO$_{0.5x+1.5y+2}$-zBaTiO$_3$ having a (001) orientation, x is not less than 0.30 and not more than 0.46, y is not less than 0.51 and not more than 0.62, z is not less than 0.07 and not more than 0.09.

BRIEF DESCRIPTION OF DRAWINGS

FIG. 12 is a graph showing the measurement result of the electric field—the amount of a deformation of the piezoelectric film fabricated in the examples 1-3 and the comparative examples 2, and 3.

DESCRIPTION OF EMBODIMENTS

Figure 1A:
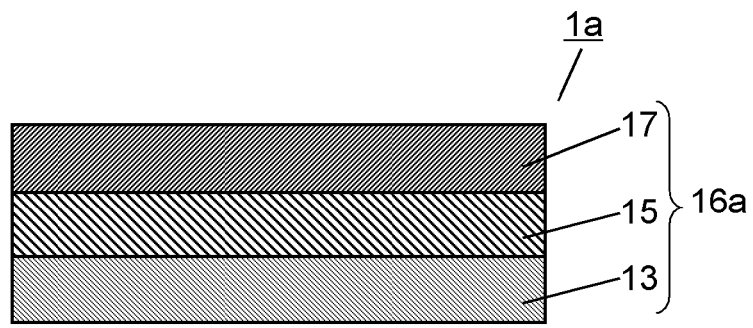
FIG. 1A is a cross-sectional view schematically showing an example of a piezoelectric film of the present invention.

The embodiment of the present invention is described below. In the following description, the same reference numerals are used to designate the same elements and parts, and therefore the overlapping description thereof can be omitted.

[Piezoelectric Film]

FIG. 1A shows one embodiment of a piezoelectric film according to the present invention. A piezoelectric film $1a$ shown in FIG. 1A has a multilayer structure $16a$. The multilayer structure $16a$ has a first electrode 13 with a (001) orientation and a $(1-z)(Na_xBi_y)TiO_{0.5x+1.5y+2}\text{-}zBaTiO_3$ layer 15 ($0.30 \leq x \leq 0.46$, $0.51 \leq y \leq 0.62$, and $0.07 \leq z \leq 0.09$) with a (001) orientation, and a second electrode 17 in this order.

These layers 13/15/17 are laminated in contact with each other. The $(1-z)(Na_xBi_y)TiO_{0.5x+1.5y+2}\text{-}zBaTiO_3$ layer 15 is a piezoelectric layer. The $(1-z)(Na_xBi_y)TiO_{0.5x+1.5y+2}\text{-}zBaTiO_3$ layer 15 has a small leak current property, a high crystallinity, a high (001) orientation, and a low dielectric loss property. Furthermore, even when an electric field of 40 kV/cm or greater is applied, the amount of the deformation of the piezoelectric film $1a$ is proportional to the applied electric field.

When x is less than 0.30, the amount of the deformation is not proportional to the applied electric field within the applied electric field range of not less than 40 kV/cm and not more than 80 kV/cm. See the comparative examples 2 and 6, which are described later.

When x is more than 0.46, the amount of the deformation is not proportional to the applied electric field within the applied electric field range of not less than 40 kV/cm and not more than 80 kV/cm. See the comparative examples 3, 7, and 8.

When y is less than 0.51, the amount of the deformation is not proportional to the applied electric field within the applied electric field range of not less than 40 kV/cm and not more than 80 kV/cm. See the comparative examples 4, 6, 7 and 8, which are described later.

When y is more than 0.62, the amount of the deformation is not proportional to the applied electric field within the applied electric field range of not less than 40 kV/cm and not more than 80 kV/cm. See the comparative example 5.

In more detail, the piezoelectric layer is represented by the composition formula of $(1-z)(Na_xBi_y)TiO_{0.5x+1.5y+2}\text{-}zBaTiO_3$. The value of z is not less than 0.7 and not more than 0.09.

Examples of the first electrode 13 with a (001) orientation are described below.

(1) a metal layer such as platinum (Pt), palladium (Pd), or gold (Au), and (2) a conductive oxide layer such as nickel oxide (NiO), ruthenium oxide ($RuO_2$), iridium oxide ($IrO_2$), strontium ruthenate ($SrRuO_3$), or lanthanum-nickelate ($LaNiO_3$).

Two or more these layers may be also used.

Among them, the $LaNiO_3$ has a perovskite-type crystal structure represented by a chemical formula $ABO_3$. The crystal structure has a lattice constant of 0.384 nm (pseudocubic crystal). Thus, the $LaNiO_3$ has a satisfactory lattice matching property with the $(1-z)(Na_xBi_y)TiO_{0.5x+1.5y+2}\text{-}zBaTiO_3$ layer 15. The $LaNiO_3$ has a (001) orientation regardless of the composition and crystal structure of a base layer thereof. The $LaNiO_3$ having a (001) orientation can be formed on a substrate made of metal such as stainless steel.

The $LaNiO_3$ may contain a small amount of impurities. The impurity is typically a rare-earth element, which substitutes for La.

Typically, the first electrode 13 made of Pt or $LaNiO_3$ can be formed by sputtering. The first electrode 13 can be formed by other film formation techniques such as pulsed laser deposition (PLD), chemical vapor deposition (CVD), sol-gel processing, and aerosol deposition (AD).

Sputtering is used to form the first electrode 13 comprising Pt or $LaNiO_3$ having a (001) orientation.

The $(1-z)(Na_xBi_y)TiO_{0.5x+1.5y+2}\text{-}zBaTiO_3$ layer ($0.30 \leq x \leq 0.46$ and $0.51 \leq y \leq 0.62$) 15 is a piezoelectric layer. The $(1-z)(Na_xBi_y)TiO_{0.5x+1.5y+2}\text{-}zBaTiO_3$ layer 15 has a plane orientation of (001) on its surface.

The value of "0.5x+1.5y+2" which represents the oxygen amount in sodium.bismuth titanate may include error. For example, when x=0.41 and y=0.53, the value of "0.5×0.41+1.5×0.53+2" is equal to 3. However, even when the amount of sodium is 0.41 and the amount of bismuth is 0.53, the oxygen amount in sodium.bismuth titanate does not always correspond with the value of "3".

The thickness of the $(1-z)(Na_xBi_y)TiO_{0.5x+1.5y+2}\text{-}zBaTiO_3$ layer 15 is not limited. The thickness thereof is at least 0.5 μm but not more than 10 μm, for example. Even when the $(1-z)(Na_xBi_y)TiO_{0.5x+1.5y+2}\text{-}zBaTiO_3$ layer 15 is thin, the $(1-z)(Na_xBi_y)TiO_{0.5x+1.5y+2}\text{-}zBaTiO_3$ layer 15 has low dielectric loss and high piezoelectric performance.

It is difficult to estimate the composition suitable for forming a piezoelectric layer having high crystallinity, high orientation, low dielectric loss, and high piezoelectric performance equivalent to that of PZT expressing linear deformation behavior to the applied electric field based on the similarity of the lattice constants or the compositions of the piezoelectric layer. This is because it is generally difficult to form a thin film composed of a multicomponent composite oxide having high crystallinity and high orientation, like $(Bi,Na,Ba)TiO_3$, due to a difference in the vapor pressure of each constituent element (except for oxygen) of the oxide. The present inventors have discovered that the $(1-z)(Na_xBi_y)TiO_{0.5x+1.5y+2}\text{-}zBaTiO_3$ layer 15 has high crystallinity and a high (001) orientation without use of a buffer layer.

The $(1-z)(Na_xBi_y)TiO_{0.5x+1.5y+2}\text{-}zBaTiO_3$ layer 15 has a perovskite-type crystal structure represented by the chemical formula $ABO_3$. The A site and B site in the perovskite structure have average valences of 2 and 4, respectively, depending on the placement of a single element or a plurality of elements. The A site is Bi, Na, and Ba. The B site is Ti. The $(1-z)(Na_xBi_y)TiO_{0.5x+1.5y+2}\text{-}zBaTiO_3$ layer 15 may contain a trace amount of impurities. The impurities typically may be Li and K to substitute for Na, and Sr and Ca to substitute for Ba, in the A site. The impurity typically may be Zr to substitute for Ti in the B site. Examples of the other impurities may include Mn, Fe, Nb, and Ta. Some of these impurities can improve the crystallinity and the piezoelectric performance of the $(1-z)(Na_xBi_y)TiO_{0.5x+1.5y+2}\text{-}zBaTiO_3$ layer 15.

A (001)-oriented layer may be further optionally sandwiched between the first electrode 13 and the $(1-z)(Na_xBi_y)TiO_{0.5x+1.5y+2}\text{-}zBaTiO_3$ layer 15. The (001)-oriented layer is, for example, a Pt layer or a $SrRuO_3$ layer.

Typically, the $(1-z)(Na_xBi_y)TiO_{0.5x+1.5y+2}\text{-}zBaTiO_3$ layer 15 can be formed by sputtering. The $(1-z)(Na_xBi_y)TiO_{0.5x+1.5y+2}\text{-}zBaTiO_3$ layer 15 can be formed by other film formation techniques such as PLD, CVD, sol-gel processing, and AD as long as it has a (001) orientation.

The second electrode 17 is formed on the $(1-z)(Na_xBi_y)TiO_{0.5x+1.5y+2}\text{-}zBaTiO_3$ layer 15. The first electrode 13 and the second electrode 17 is used for applying a voltage to the $(1-z)(Na_xBi_y)TiO_{0.5x+1.5y+2}$-$zBaTiO_3$ layer 15.

The second electrode 17 is preferably made of metal having low electrical resistance. The second electrode 17 may be made of conductive oxide such as NiO, $RuO_2$, $IrO_3$, $SrRuO_3$, or $LaNiO_3$. The second electrode 17 may be made of two or more these materials. An adhesive layer (not shown) improving an adhesion between the second electrode 17 and the $(1-z)(Na_xBi_y)TiO_{0.5x+1.5y+2}$-$zBaTiO_3$ layer 15 may be optionally provided therebetween. An example of the material of the adhesive layer is titanium (Ti), tantalum (Ta), iron (Fe), cobalt (Co), nickel (Ni), chrome (Cr), or a compound thereof. The titanium is preferred. The adhesive layer may be composed of two or more these materials.

In the embodiment 1, an electric field (hereinafter, referred to as "applied electric field") of not less than 40 kV/cm and not more than 80 kV/cm may be applied to the $(1-z)(Na_xBi_y)TiO_{0.5x+1.5y+2}$-$zBaTiO_3$ layer 15 through the second electrode 17 and the first electrode 13.

The applied electric field of less than 40 kV/cm is insufficient for the ejection of an exact amount of an ink, for the measurement of an exact angular velocity, and for the electric power generation due to positive piezoelectric effect. On the contrary, when the applied electric field of more than 80 kV/cm is applied, the amount of the obtained deformation tends not to be proportional to the applied electric field.

The relationship between the amount of the deformation and the applied electric field is described below.

For the angular velocity sensor capable of measuring an exact angular velocity, for the ink jet head capable of ejecting an exact amount of an ink, and for the piezoelectric generating element capable of generating electric power due to positive piezoelectric effect, the amount of the deformation is required to be proportional to the electric field. In other words, the amount b of the deformation and the electric field a are required to satisfy the following equation (1).

$$b=c_1 a \quad \text{Equation (1) } (c_1 \text{ is constant})$$

The term "proportion" in the present specification means that the values of a and b satisfy the above-mentioned equation (1). In other words, the term "proportion" means a linear function.

Figure 11A:
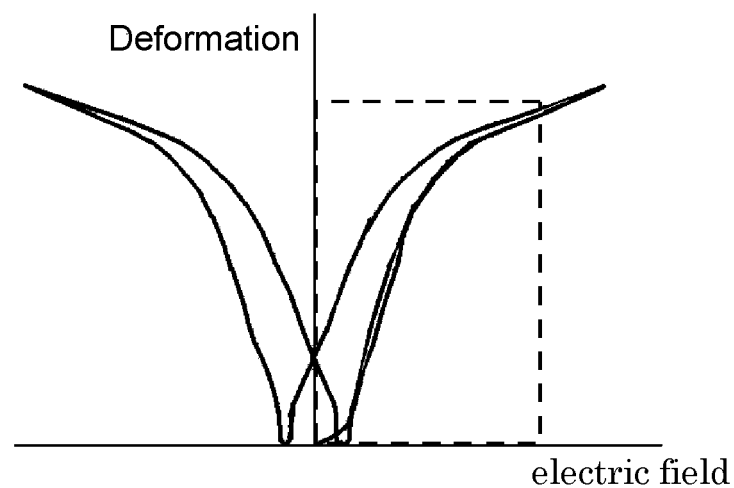
FIG. 11A is a graph of an electric field—an amount of a deformation of a common piezoelectric material.
Figure 11B:
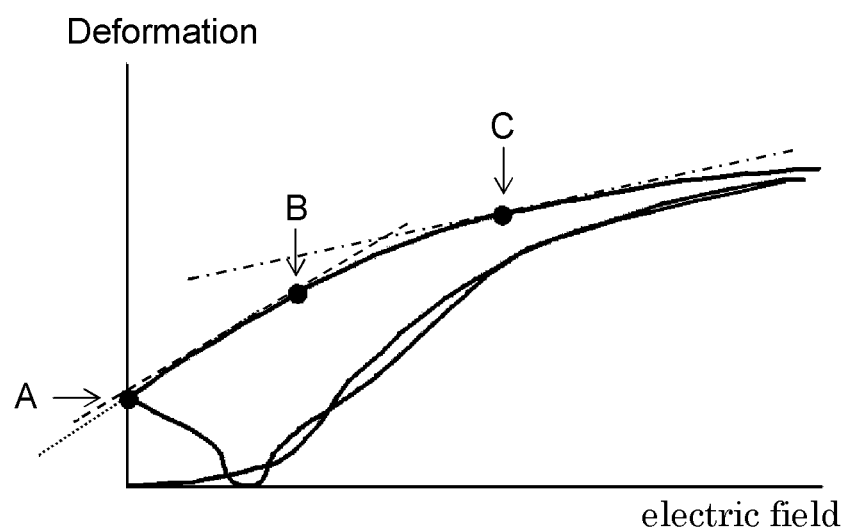
FIG. 11B is a partial enlarged graph of FIG. 11A.

FIG. 11A shows a graph of an electric field—an amount of an deformation property of a common piezoelectric material. See FIG. 4 of Patent Literature 2. FIG. 11B shows a partially enlarged view of FIG. 11A.

As shown in FIG. 11B, the inclination of the tangent line at the dot A is substantially equal to the inclination of the tangent line at the dot B. The phrase "substantially equal" means that the ratio represented by the formula: (the inclination of the tangent line at the dot A)/(the inclination of the tangent line at the dot B) is not less than 0.8 and not more than 1.2. This means that the amount b of the deformation is proportional to the electric field a. The applied electric fields at the dot A and at the dot B are, for example, 40 kV/cm and 80 kV/cm, respectively.

On the other hand, the tangent line at the dot C has a smaller inclination than the tangent lines at the dot A and at the dot B.

When the amount b of the deformation and the electric field a has a relationship of a non-linear function, it is difficult to measure an exact angular velocity, to eject an exact amount of an ink, and to generate an electric power due to positive piezoelectric effect. For the angular velocity sensor capable of measuring an exact angular velocity, for the ink jet head capable of ejecting an exact amount of an ink, and for the piezoelectric generating element capable of generating electric power due to positive piezoelectric effect, the relationship of the non-linear function is not suitable for the amount b of the deformation and the electric field a.

Figure 4:
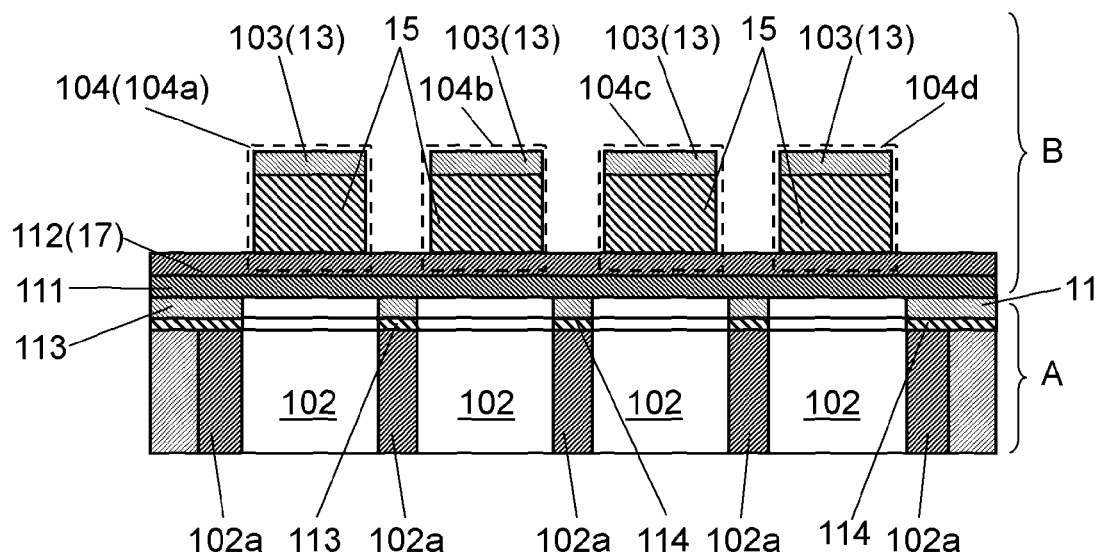
FIG. 4 is a cross-sectional view schematically showing an example of the main parts including the pressure chamber member and the actuator part in the ink jet head shown in FIG. 2.

However, according to the graph of the electric field—the amount of the deformation of "BNT_08 7" disclosed in FIG. 4 of Patent Literature 2, the electric field—the deformation property of a non-linear function is seen when the value of the applied electric field is more than 10 kV/cm. Specifically, the amount of the deformation to the applied electric field with regard to the applied electric field of 10 kV/cm or more tend to become far from the extended line formed by connecting the dot at the amount of the deformation at 0 kV/cm (a condition where no electric field is applied) with the dot at the amount of the deformation at 10 kV/cm together with the increase of the applied electric field. In other words, the amount of the deformation fails to be proportional to the electric field.

As described later, in the case of the comparative example 6 having an identical composition to that of "BNT_08 7", the amount b of the deformation of the obtained piezoelectric film varied like a non-linear function. Accordingly, the piezoelectric film fails to be suitable for an angular velocity sensor, an ink jet head, and a piezoelectric generating element.

Figure 1B:
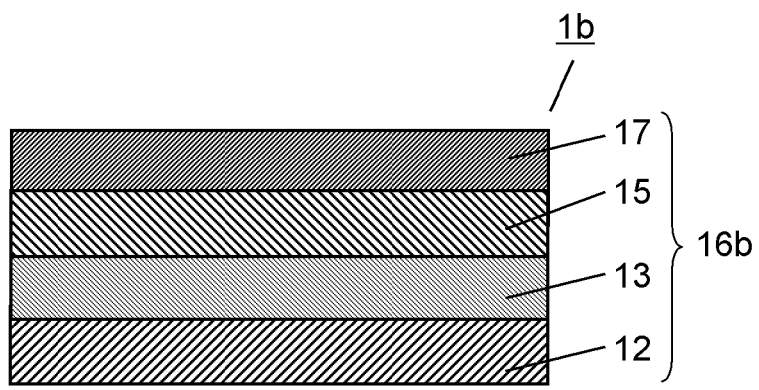
FIG. 1B is a cross-sectional view schematically showing another example of the piezoelectric film of the present invention.

FIG. 1B shows another embodiment of the piezoelectric film according to the present invention. A piezoelectric film 1b shown in FIG. 1B has a multilayer structure 16b. The multilayer structure 16b is a structure in which the multilayer structure 16a shown in FIG. 1A further includes a metal electrode layer 12. In the multilayer structure 16b, the first electrode 13 is formed on this metal electrode layer 12. Particularly, the multilayer structure 16b has the metal electrode layer 12, the first electrode 13 having a (001) orientation, and the $(1-z)(Na_xBi_y)TiO_{0.5x+1.5y+2}$-$zBaTiO_3$ layer 15 having a (001) orientation, in this order. These layers are laminated in contact with each other.

An example of the material for the metal electrode layer 12 is metal such as platinum (Pt), palladium (Pd), or gold (Au); conductive oxide such as nickel oxide (NiO), ruthenium oxide ($RuO_2$), iridium oxide ($IrO_2$), or strontium ruthenate ($SrRuO_3$). The metal electrode layer 12 can be made of two or more these materials. Preferably, the metal electrode layer 12 has a low electrical resistance and a high heat resistance. Therefore, it is preferred that the metal electrode layer 12 is a Pt layer. The Pt layer may have a (111) orientation.

That is, the piezoelectric film according to the present invention may further comprise a Pt layer. The first electrode 13 may be formed on the Pt layer.

The metal electrode layer 12 can serve as an electrode layer for applying a voltage to the $(1-z)(Na_xBi_y)TiO_{0.5x+1.5y+2}$-$zBaTiO_3$ layer 15, which is a piezoelectric layer, together with the first electrode 13. In other words, the electrode layer is a laminate composed of the first electrode 13 and the metal electrode layer 12.

The piezoelectric film 1b shown in FIG. 1B can be manufactured by forming the first electrode 13 and the $(1-z)(Na_xBi_y)TiO_{0.5x+1.5y+2}$-$zBaTiO_3$ layer 15 on the metal electrode layer 12 in this order.

Figure 1C:
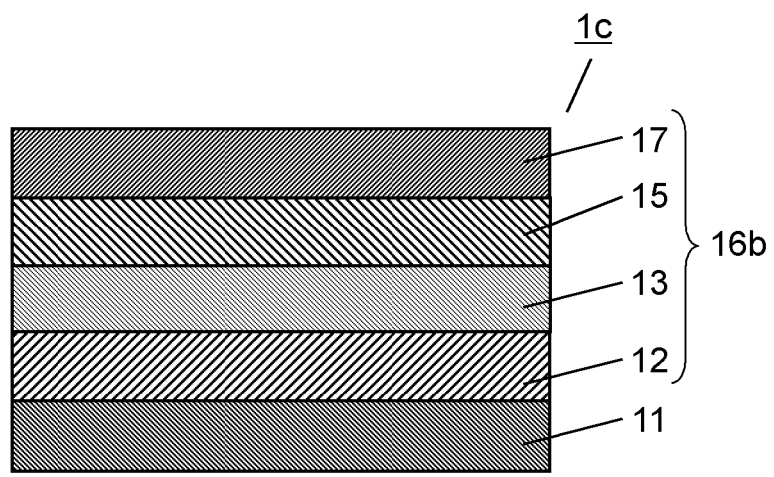
FIG. 1C is a cross-sectional view schematically showing still another example of the piezoelectric film of the present invention.

In the piezoelectric film 1c shown in FIG. 1C, the multilayer structure 16c shown in FIG. 1B is formed on the substrate 11.

The substrate 11 may be a MgO substrate. A MgO monocrystalline substrate is preferred.

An adhesive layer improving an adhesion between the substrate 11 and the multilayer structure 16b (more particularly, between the substrate 11 and the metal electrode layer 12) may be optionally provided therebetween. The adhesive layer is required to be conductive. An example of the material of the adhesive layer is titanium (Ti), tantalum (Ta), iron (Fe), cobalt (Co), nickel (Ni), chrome (Cr), or a compound thereof. The adhesive layer may be composed of two or more these materials.

The piezoelectric films 1a and 1b shown in FIG. 1A and FIG. 1B may be fabricated with use of a base substrate. Particularly, one of the multilayer structures 16a and 16b may be formed on the base substrate to remove the base substrate. Thus, the piezoelectric films 1a and 1b may be fabricated. The base substrate may be removed by a known method such as etching.

The piezoelectric film 1c shown in FIG. 1C may be also fabricated with use of a base substrate. Specifically, after the multilayer structure 16b is formed on the base substrate, the base substrate is removed. Subsequently, the multilayer structure 16b may be disposed on the substrate 11 which is prepared separately. Thus, the piezoelectric film 1c may be fabricated.

An example of the material of the base substrate is the following (1) to (7).

(1) a substrate made of an oxide having a NaCl type structure such as MgO;

(2) a substrate made of an oxide having a perovskite structure, such as $SrTiO_3$, $LaAlO_3$, and $NdGaO_3$;

(3) a substrate made of an oxide having a corundum structure, such as $Al_2O_3$;

(4) a substrate made of an oxide having a spinel structure, such as $MgAl_2O_4$;

(5) a substrate made of an oxide having a rutile structure, such as $TiO_2$;

(6) a substrate made of an oxide having a cubic crystal structure, such as $(La,Sr)(Al,Ta)O_3$, and yttria-stabilized zirconia (YSZ); and (7) a substrate made of stainless-steel These materials have a greater linear thermal expansion coefficient than the $(1-z)(Na_xBi_y)TiO_{0.5x+1.5y+2}$-$zBaTiO_3$ layer 15.

The base substrate can be formed by laminating an oxide layer having a NaCl type crystal structure on the surface of a metal substrate such as a stainless steel substrate. In this case, the metal electrode layer 12 or the first electrode 13 can be formed on the surface of the oxide layer. An example of the oxide layer is a MgO layer, a NiO layer, or a cobalt oxide (CoO) layer.

As described above, the present method of fabricating piezoelectric film may comprise a step of forming the first electrode 13 on the base substrate directly or via another layer such as the metal electrode layer 12. After the base substrate which can double as the substrate 11 is removed, a different substrate may be disposed. In this case, the different substrate may be disposed so that the different substrate is in contact with the metal electrode layer 12 or the first electrode 13. The different substrate may be disposed so that the different substrate is in contact with the $(1-z)(Na_xBi_y)TiO_{0.5x+1.5y+2}$-$zBaTiO_3$ layer 15. In the latter case, a piezoelectric film where the $(1-z)(Na_xBi_y)TiO_{0.5x+1.5y+2}$-$zBaTiO_3$ layer 15, and the first electrode 13 are formed on the different substrate in this order is obtained.

[Ink Jet Head]

An ink jet head of the present invention will be described below with reference to FIG. 2 to FIG. 4.

Figure 2:
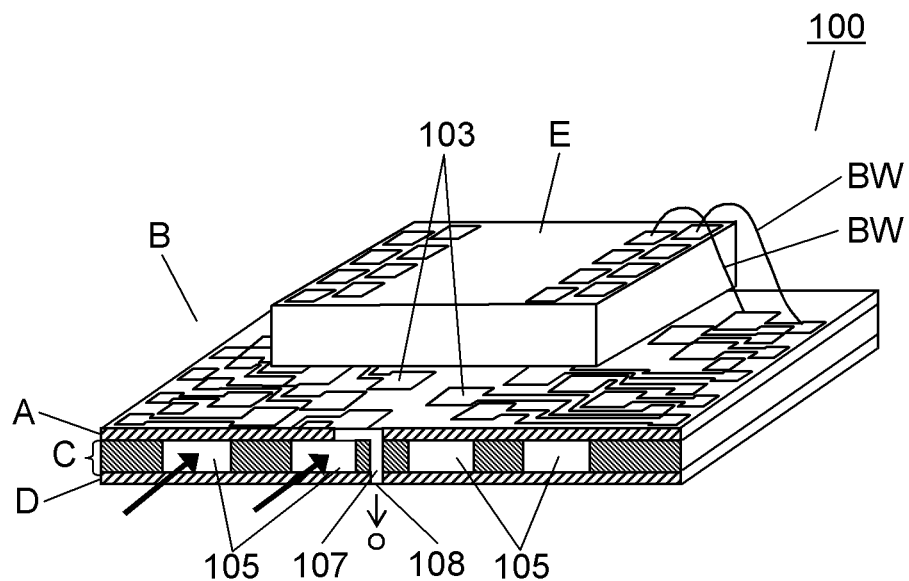
FIG. 2 is a perspective view schematically showing an example of an ink jet head of the present invention and partially showing a cross section of the ink jet head.

FIG. 2 shows one embodiment of the ink jet head of the present invention. FIG. 3 is an exploded view showing main parts including a pressure chamber member and an actuator part in an ink jet head 100 shown in FIG. 2.

Figure 3:
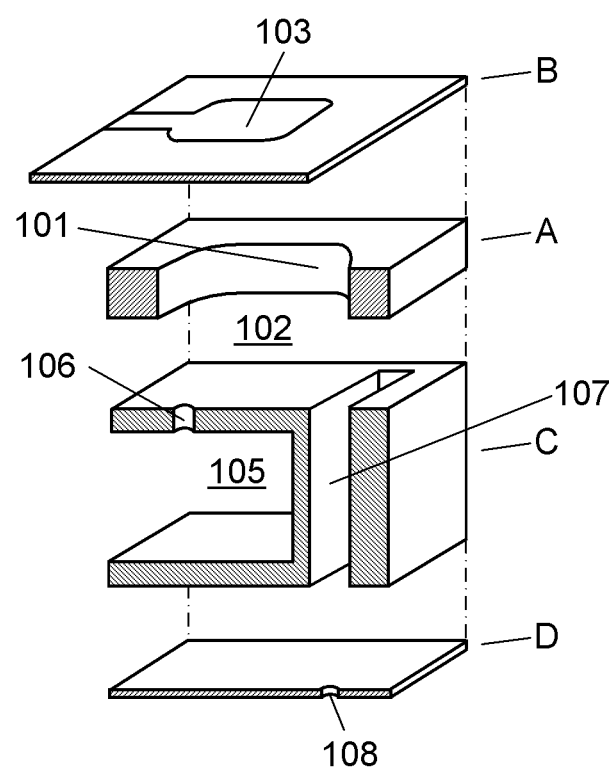
FIG. 3 is an exploded perspective view schematically showing main parts including a pressure chamber member and an actuator part in the ink jet head shown in FIG. 2 and partially showing a cross section of the main parts.

A reference character A in FIG. 2 and FIG. 3 indicates a pressure chamber member. The pressure chamber member A includes through-holes 101 that penetrate therethrough in its thickness direction (in the upward and downward directions in these diagrams). The through-hole 101 shown in FIG. 3 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 2 and FIG. 3, a reference numeral 103 indicates an individual electrode layer that is a part of the piezoelectric film. As shown in FIG. 2, in the ink jet head 100, a plurality of individual electrode layers 103, that is, piezoelectric films are arranged in a zigzag pattern in plan view.

The ink passage member C has a plurality of common liquid chambers 105 arranged in stripes in plan view. In FIG. 2 and FIG. 3, each of the common liquid chambers 105 is aligned over a plurality of pressure chambers 102 in plan view. The common liquid chambers 105 extend in the ink supply direction (in the direction indicated by arrows in FIG. 2) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 2, a reference character E indicates an IC chip. The IC chip E is connected electrically to the individual electrode layers 103, which are exposed on the surface of the actuator part B, through bonding wires BW. For simplicity of FIG. 2, only a part of the bonding wires BW are shown in FIG. 2.

FIG. 3 shows the configuration of the main parts including the pressure chamber member A and the actuator part B. FIG. 4 shows the cross section perpendicular to the ink supply direction (in the direction indicated by the arrows in FIG. 2) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

As surrounded by the dashed-line in FIG. 4, the above-mentioned piezoelectric films 104 are arranged in the ink jet head. The piezoelectric film is the piezoelectric film described in the item titled as "Piezoelectric film".

Though not indicated in FIG. 4, as described in FIGS. 1B, 1D, 1E, the metal electrode layer 12 can be included.

[Image Forming Method by Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

[Angular Velocity Sensor]

Figure 5:
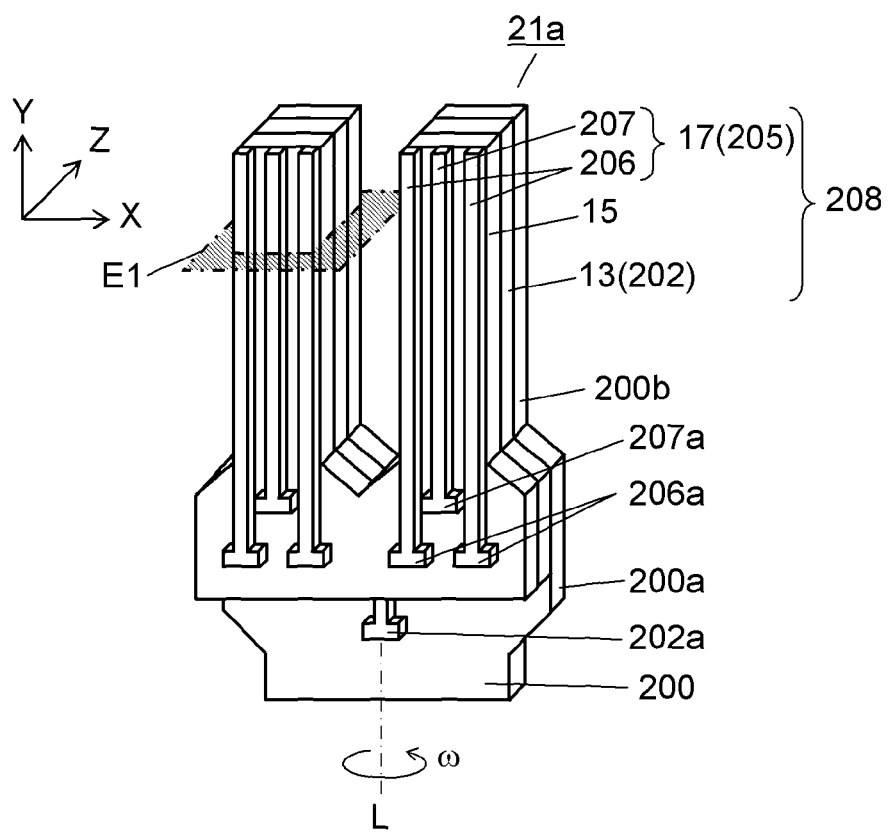
FIG. 5 is a perspective view schematically showing an example of an angular velocity sensor of the present invention.
Figure 6:
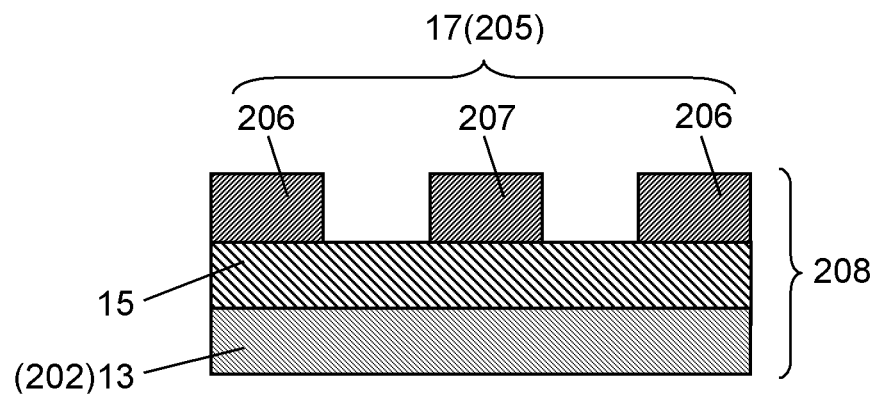
FIG. 6 is a cross-sectional view showing a cross section E1 of the angular velocity sensor shown in FIG. 5.

FIG. 5 shows examples of an angular velocity sensor of the present invention. FIG. 6 shows a cross section E1 of an angular velocity sensor 21a shown in FIG. 5. The angular velocity sensor 21a shown in FIG. 5 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 5 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 5. The substrate 200 has a shape of a tuning fork including two arms (vibration parts 200b), when viewed from the thickness direction of the substrate 200 (the Z direction in FIG. 5).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric film described in the item titled as "Piezoelectric film". As shown in FIG. 5 and FIG. 6, the piezoelectric film 208 comprises the first electrode 13 (202), the piezoelectric layer 15, and the second electrode 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 5). More particularly, in the angular velocity sensor shown in FIG. 5, a pair of drive electrodes 206 are provided on both of the width-direction edge portions of the vibration part 200b along the length direction thereof (the Y direction in FIG. 5). Only one drive electrode 206 may be provided on one of the width-direction edge portions of the vibration part 200b. In the angular velocity sensor shown in FIG. 5, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 5).

In the angular velocity sensor of the present invention, one of the first electrode and the second electrode selected therefrom can be composed of an electrode group including the drive electrode and the sense electrode. In the angular velocity sensor 21a shown in FIG. 5, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 5, the connection terminals are provided on the stationary part 200a.

In the angular velocity sensor shown in FIG. 5, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 5 has one vibration part group consisting of a pair of vibration parts 200b.

[Method of Measuring Angular Velocity by Angular Velocity Sensor]

The angular velocity measuring method of the present invention uses the angular velocity sensor of the present invention, and includes the steps of; applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 5 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 5). In the angular velocity sensors 21a shown in FIG. 5, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the mode in which they vibrate in the directions opposite to each other, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and an angular velocity ω is true:

$$Fc=2mv\omega$$

where v is the velocity of the oscillating vibration part 200b in the oscillation direction, and m is the mass of the vibration part 200b. As shown in this equation, the angular velocity ω can be calculated from the Coriolis force Fc.

[Piezoelectric Generating Element]

Figure 7:
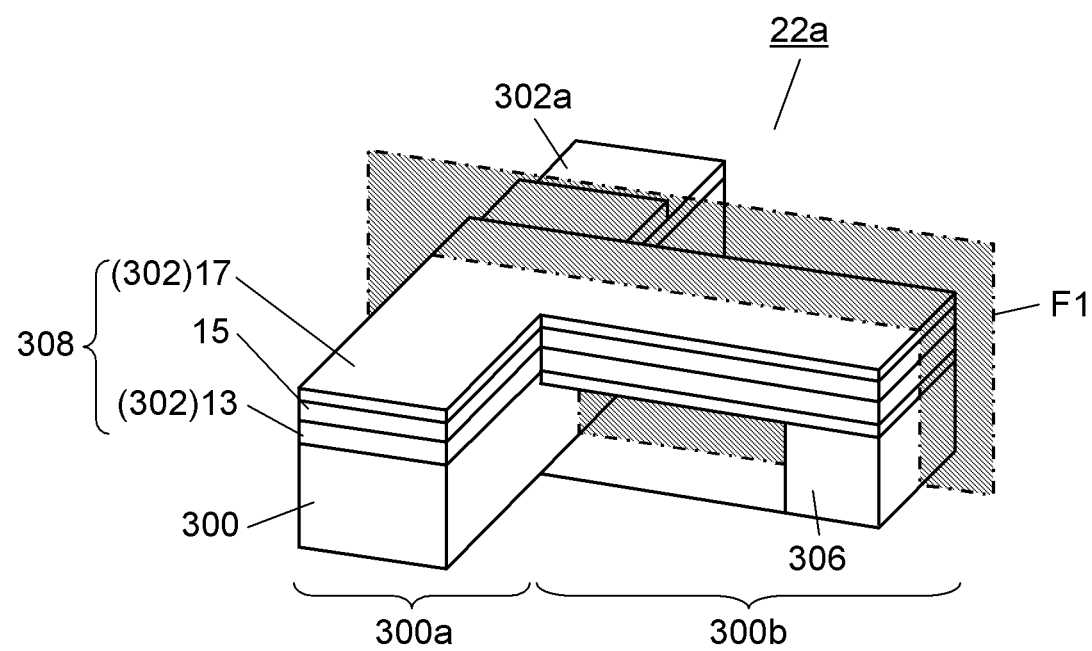
FIG. 7 is a perspective view schematically showing an example of a piezoelectric generating element of the present invention.
Figure 8:
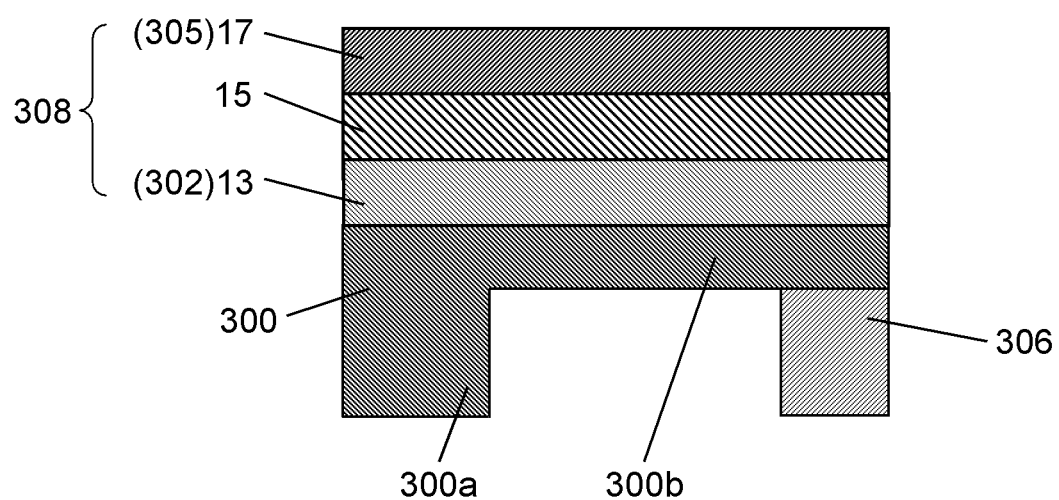
FIG. 8 is a cross-sectional view showing a cross section F1 of the piezoelectric generating element shown in FIG. 7.

FIG. 7 shows an example of the piezoelectric generating element of the present invention. FIG. 8 shows a cross section F1 of a piezoelectric generating element 22a shown in FIG. 7. The piezoelectric generating elements 22a are elements that convert externally-applied mechanical vibration into electrical energy. The piezoelectric generating elements 22a are applied suitably to a self-sustained power supply for generating electric power from various vibrations including engine vibrations and driving vibrations generated in vehicles and machines, and vibrations generated during walking.

The piezoelectric generating element 22a shown in FIG. 7 includes a substrate 300 having a vibration part 300b and a piezoelectric film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric film described in the item titled as "Piezoelectric film". As shown in FIG. 7 and FIG. 8, the piezoelectric film 308 comprises the first electrode 13 (302), the piezoelectric layer 15, the second electrode 17 (305).

In the piezoelectric generating elements shown in FIG. 7, a part of the first electrode 302 is exposed. This part can serve as a connection terminal 302a.

In the piezoelectric generating element shown in FIG. 7, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

EXAMPLES

Hereinafter, the present invention is described in more detail with reference to examples. The present invention is not limited to the following examples.

Example 1

In the example 1, a piezoelectric film shown in FIG. 1C was fabricated. The piezoelectric film comprised the substrate 11, the first electrode 13, $(1-z)(Na_xBi_y)TiO_{0.5x+1.5y+2}$-$zBaTiO_3$ layer (x=0.37, y=0.58, z=0.07) 15, and the second electrode 17 in this order. The piezoelectric film was fabricated as below.

A Pt layer (with a thickness of 250 nm) having a (100) orientation was formed by RF magnetron sputtering on the surface, having a plane orientation of (100), of the MgO monocrystalline substrate. The Pt layer corresponds to the first electrode 13. The Pt layer was formed using a metallic Pt target in an argon (Ar) gas atmosphere under the film formation conditions of an RF power of 15 W and a substrate temperature of 300 degrees Celsius.

Next, a $(1-z)(Na_xBi_y)TiO_{0.5x+1.5y+2}$-$zBaTiO_3$ layer 15 (x=0.37, y=0.58, and z=0.07) (with a thickness of 2.7 μm) having composition around the Morphotropic Phase Boundary was formed by RF magnetron sputtering on the surface of the first electrode 13. This layer corresponds to a (Bi,Na,Ba)TiO$_3$ layer 15. This layer 15 was formed using a target having the above-mentioned composition in a mixed gas atmosphere of Ar and oxygen (with a flow ratio between Ar and O$_2$ of 50:50) under the film formation conditions of an RF power of 170 W and a substrate temperature of 650 degrees Celsius. The composition of the formed $(1-z)(Na_xBi_y)TiO_{0.5x+1.5y+2}$-$zBaTiO_3$ layer 15 (x=0.37, y=0.58, and z=0.07) was analyzed by energy dispersive X-ray spectrometry (SEM-EDX). In the measurement with use of the SEM-EDX, it was difficult to quantify a light element such as oxygen (O) accurately, since the analysis accuracy of the light element was low. However, it was confirmed that the composition of Na, Bi, Ba, and Ti contained in the formed $(1-z)(Na_xBi_y)TiO_{0.5x+1.5y+2}$-$zBaTiO_3$ layer 15 (x=0.37, y=0.58, and z=0.07) was identical to the composition of the target.

The formed $(1-z)(Na_xBi_y)TiO_{0.5x+1.5y+2}$-$zBaTiO_3$ layer 15 (x=0.37, y=0.58, and z=0.07) was subjected to an X-ray diffraction analysis to analyze the crystal structure thereof. The X-ray diffraction analysis was carried out in such a manner that the surface of the $(1-z)(Na_xBi_y)TiO_{0.5x+1.5y+2}$-$zBaTiO_3$ layer 15 was irradiated with an X-ray beam.

Figure 9:
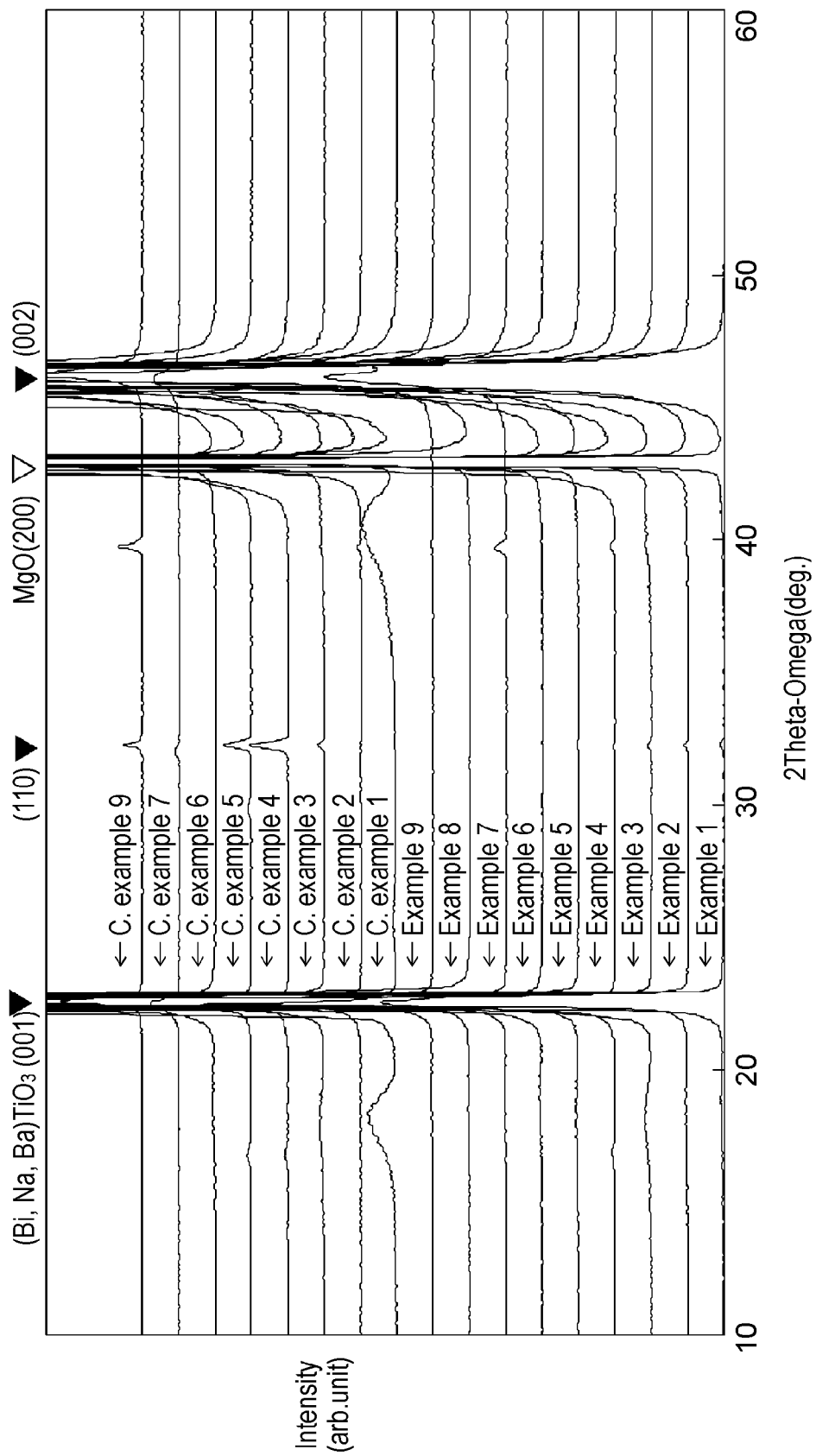
FIG. 9 is a graph showing X-ray diffraction profiles of piezoelectric films fabricated in the examples 1-8 and the comparative examples 1-8.
Figure 10:
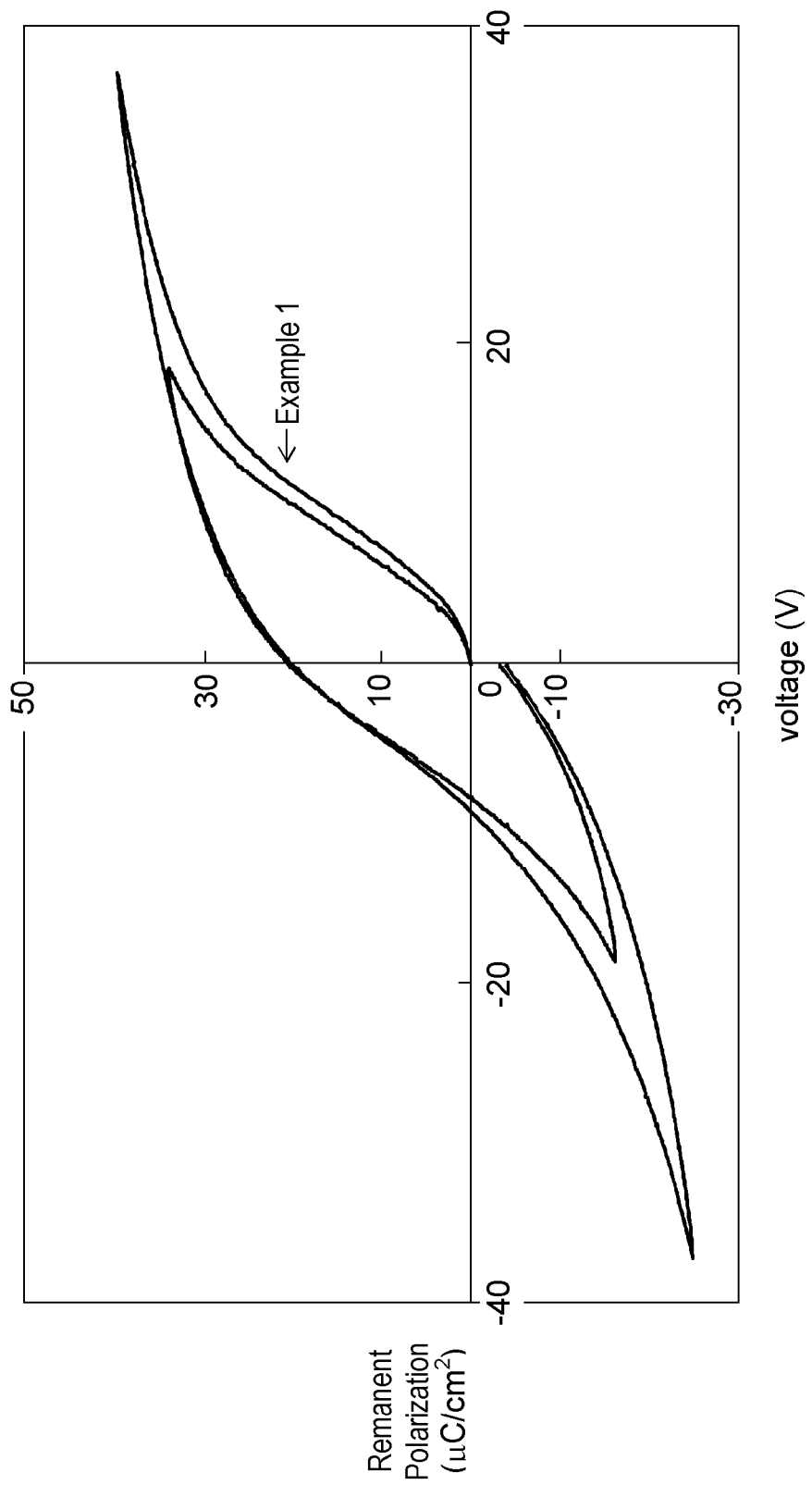
FIG. 10 is a graph showing P-E hysteresis loops of the piezoelectric films fabricated in the example 1.

FIG. 9 shows the result. In the following comparative examples, the identical X-ray diffraction analysis was used.

FIG. 9 shows the results of the X-ray diffraction profile. Observed was only the reflection peak derived from the (001)-oriented $(1-z)(Na_xBi_y)TiO_{0.5x+1.5y+2}$-$zBaTiO_3$ layer, except for the reflection peaks derived from the MgO substrate and the Pt layer. The intensity of the (001) reflection peak was 256,075 cps, which was a very high level. The profile shown in FIG. 9 means that the $(1-z)(Na_xBi_y)TiO_{0.5x+1.5y+2}$-$zBaTiO_3$ layer fabricated in the example has a significantly high (001) orientation.

Subsequently, the half value width of the (001) reflection peak derived from the $(1-z)(Na_xBi_y)TiO_{0.5x+1.5y+2}$-$zBaTiO_3$ layer in the profile was obtained by rocking curve measurement. The rocking curve measurement is a measurement in which the incident angle of the X-ray beam to the sample is scanned while the diffraction angle 2θ is fixed to the diffraction angle of the reflection peak to be measured. The smaller the half value width is, the higher the crystallinity is. As a result, The obtained half value width corresponds to the degree of tilt of the crystallographic axis in the direction perpendicular to the main surface of the layer. The smaller the half value width is, the higher the crystallinity is. As a result, the obtained half value width was a very small value of 0.24°. This means that the $(1-z)(Na_xBi_y)TiO_{0.5x+1.5y+2}$-$zBaTiO_3$ layer fabricated in the example 1 has extremely high crystallinity. In the following examples and the comparative examples, the same rocking curve measurement was used to measure the half value widths of the reflection peaks.

Next, an Au layer with a thickness of 100 nanometers was formed by vapor deposition on the surface of the $(1-z)(Na_xBi_y)TiO_{0.5x+1.5y+2}$-$zBaTiO_3$ layer 15. This Au layer corresponds to the second electrode 17. Thus, the piezoelectric film according to the example was prepared.

The ferroelectric property and piezoelectric performance of the piezoelectric film were evaluated. FIG. 18 shows a P-E hysteresis loop of the piezoelectric film according to the example 1.

As shown in FIG. 18, it was confirmed that the piezoelectric film exhibited better ferroelectric properties with an increase in the electric field applied to the piezoelectric layer through the Pt layer and the Au layer. An impedance analyzer was used to measure the dielectric loss (tan δ) at 1 kHz. As a result, the value of tan δ of the piezoelectric film was 3.6%. This means that the leak current of the piezoelectric film is small.

The piezoelectric performance of the piezoelectric film was evaluated in the following manner. The piezoelectric film was cut into a strip with a width of 2 mm and worked into a cantilever shape. An electric field was applied between the Pt layer and the Au layer, and the resulting relative displacement of the cantilever was measured with a laser displacement meter. FIG. 12 shows the measurement result of the electric field—the amount of the deformation. The dashed line in FIG. 12 was drawn by connecting the original point with the dot at the amount of the deformation at the applied electric field of 40 kV/cm. The amount of the deformation at the applied electric field of 0 kV/cm denotes 0 micrometer. The measured amount of the deformation was converted into a piezoelectric constant $d_{31}$ to evaluate the piezoelectric performance. When the applied electric field of 40 kV/cm was applied, the piezoelectric constant $d_{31}$ (40 kV/cm) of the piezoelectric film according to the example 1 was a high value of −144 pC/N. The linearity of the piezoelectric performance was estimated from the ratio of $d_{31}$ at the applied electric field of 40 kV/cm to $d_{31}$ at the applied electric field of 80 kV/cm. The ratio of $d_{31}$ (40 kV/cm)/$d_{31}$ (80 kV/cm) was 1.03. This means that the amount of the deformation of the piezoelectric film is proportional to the applied electric field, and that the piezoelectric film has an excellent deformation property.

Example 2

An identical experiment to that of the example 1 was performed except for x=0.30, y=0.56, and z=0.07.

The intensity of the (001) reflection peak according to the example 2 was a very strong value of 139,961 cps. FIG. 12 shows the measurement result of the electric field—the amount of the deformation. The $d_{31}$ (40 kV/cm) of the piezoelectric film according to the example 2 was a high value of −117 pC/N. The ratio of $d_{31}$ (40 kV/cm)/$d_{31}$ (80 kV/cm) was 1.08. This means that the amount of the deformation was proportional to the applied electric field.

Example 3

An identical experiment to that of the example 1 was performed except for x=0.46, y=0.55, and z=0.07.

The intensity of the (001) reflection peak according to the example 3 was a very strong value of 106,869 cps. FIG. 12 shows the measurement result of the electric field—the amount of the deformation. The $d_{31}$ (40 kV/cm) of the piezoelectric film according to the example 3 was a high value of −101 pC/N. The ratio of $d_{31}$ (40 kV/cm)/$d_{31}$ (80 kV/cm) was 1.15. This means that the amount of the deformation was proportional to the applied electric field.

Example 4

An identical experiment to that of the example 1 was performed except for x=0.38, y=0.51, and z=0.07.

Figure 13:
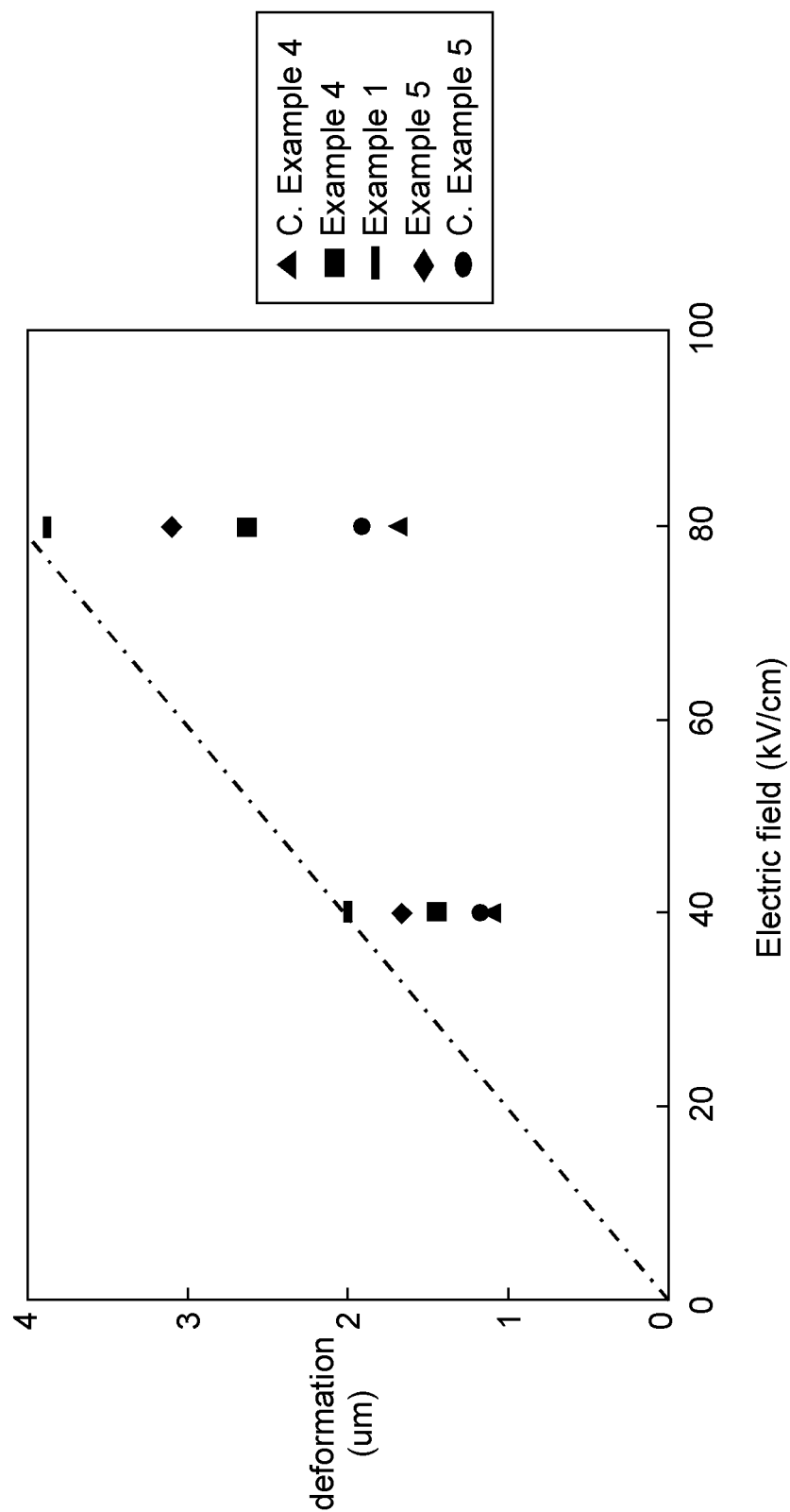
FIG. 13 is a graph showing the measurement result of the electric field—the amount of a deformation of the piezoelectric film fabricated in the examples 1, 4, and 5, and the comparative examples 4, and 5.

The intensity of the (001) reflection peak according to the example 4 was a very strong value of 76,040 cps. FIG. 13 shows the measurement result of the electric field—the amount of the deformation. The $d_{31}$ (40 kV/cm) of the piezoelectric film according to the example 4 was a high value of −104 pC/N. The ratio of $d_{31}$ (40 kV/cm)/$d_{31}$ (80 kV/cm) was 1.09. This means that the amount of the deformation was proportional to the applied electric field.

Example 5

An identical experiment to that of the example 1 was performed except for x=0.39, y=0.62, and z=0.07.

The intensity of the (001) reflection peak according to the example 5 was a very strong value of 143,377 cps. FIG. 13 shows the measurement result of the electric field—the amount of the deformation. The $d_{31}$ (40 kV/cm) of the piezoelectric film according to the example 5 was a high value of −119 pC/N. The ratio of $d_{31}$ (40 kV/cm)/$d_{31}$ (80 kV/cm) was 1.06. This means that the amount of the deformation was proportional to the applied electric field.

Example 6

An identical experiment to that of the example 1 was performed except that 0.2 mol % of manganese was added to the (1-z)(Na$_x$,Bi$_y$)TiO$_{0.5x+1.5y+2}$-zBaTiO$_3$ layer.

Figure 14:
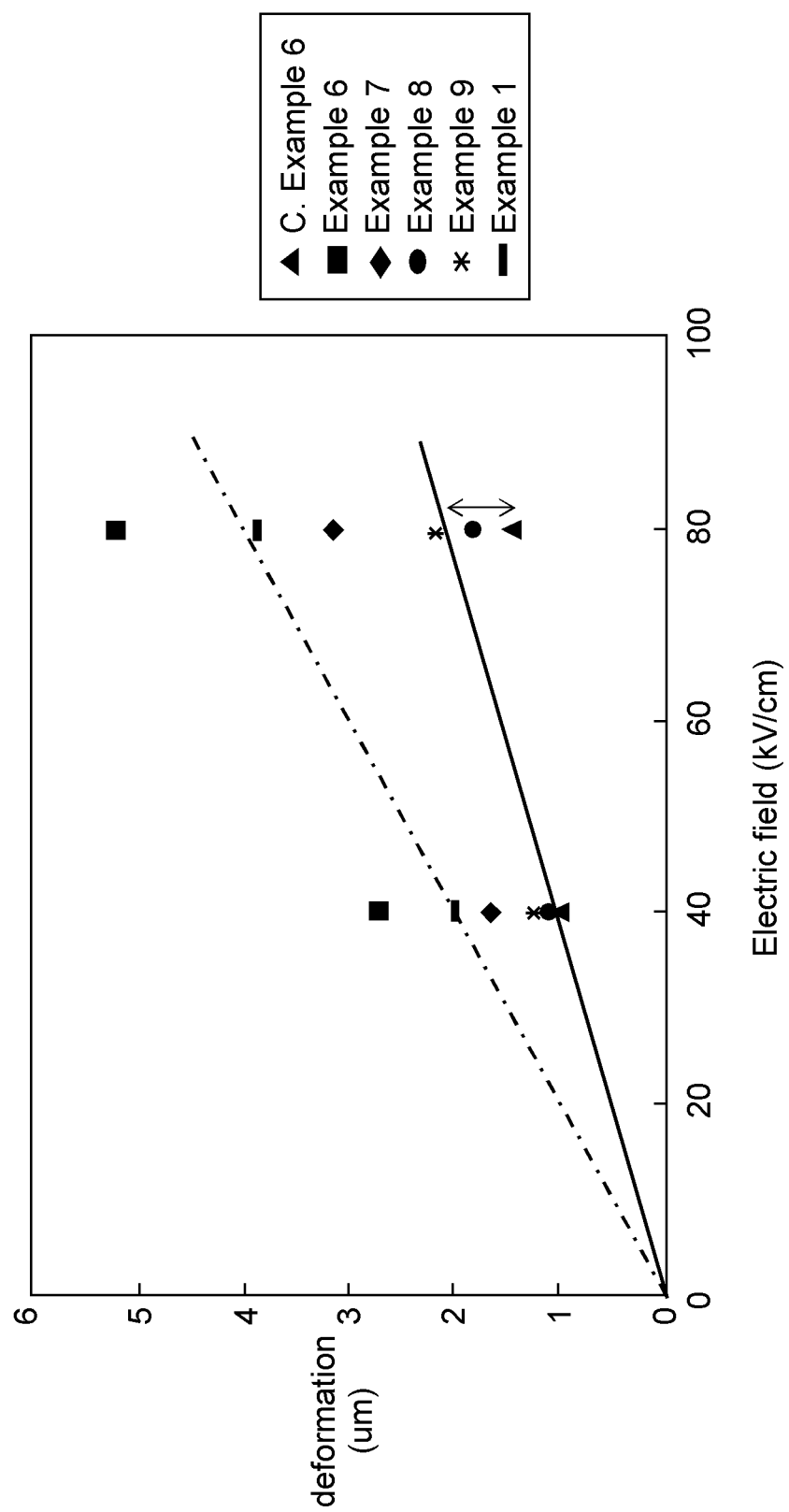
FIG. 14 is a graph showing the measurement result of the electric field—the amount of a deformation of the piezoelectric film fabricated in the examples 1, and 6-9, and the comparative example 6.

The intensity of the (001) reflection peak according to the example 6 was a very strong value of 214,498 cps. FIG. 14 shows the measurement result of the electric field—the amount of the deformation. The $d_{31}$ (40 kV/cm) of the piezoelectric film according to the example 6 was a high value of −195 pC/N. The ratio of $d_{31}$ (40 kV/cm)/$d_{31}$ (80 kV/cm) was 1.04. In other words, the amount of the deformation of the piezoelectric film was linear with regard to the applied electric field. This means that the amount of the deformation was proportional to the applied electric field. Furthermore, the addition of manganese improved the piezoelectric constant significantly.

Example 7

An identical experiment to that of the example 1 was performed except for x=0.38, y=0.56, and z=0.09.

The intensity of the (001) reflection peak according to the example 7 was a very strong value of 194,879 cps. FIG. 14 shows the measurement result of the electric field—the amount of the deformation. The $d_{31}$ (40 kV/cm) of the piezoelectric film according to the example 7 was a high value of −118 pC/N. The ratio of $d_{31}$ (40 kV/cm)/$d_{31}$ (80 kV/cm) was 1.11. This means that the amount of the deformation was proportional to the applied electric field.

Example 8

An identical experiment to that of the example 1 was performed except that the MgO substrate was substituted with a stainless-steel substrate and that the Pt layer was substituted with a laminate composed of a Pt layer and a LaNiO$_3$ layer. The piezoelectric film according to the example 8 was formed as below.

A Pt layer (with a thickness of 250 nm) having a (111) orientation was formed by RF magnetron sputtering on the surface of the metal plate made of stainless-steel. The Pt layer corresponds to the Pt electrode layer 12. The Pt layer was formed using a metallic Pt target in an argon (Ar) gas atmosphere under the film formation conditions of an RF power of 15 W and a substrate temperature of 300 degrees Celsius. Before the Pt layer was formed, a Ti layer (with a thickness of 2.5 nm) was formed on the surface of the stainless-steel plate to improve the adhesion between the stainless-steel plate and the Pt layer. The Ti layer was formed by the same method as the method of forming Pt layer except that a metallic Ti was used as a target instead of the metallic Pt.

Next, the LaNiO$_3$ layer with a (001) orientation (with a thickness of 200 nm) was formed by RF magnetron sputtering on the surface of the Pt layer. This LaNiO$_3$ layer 13 was formed using LaNiO3 having stoichiometry composition as a target in a mixed gas atmosphere of Ar and oxygen (with a flow ratio between Ar and O$_2$ of 80:20) under the film formation conditions of an RF power of 100 W and a substrate temperature of 300 degrees Celsius.

Next, the (1-z)(Na$_x$Bi$_y$)TiO$_{0.5x+1.5y+2}$-zBaTiO$_3$ layer (x=0.37, y=0.58, and z=0.07, with a thickness of 2.7 μm) having composition around the Morphotropic Phase Boundary was formed on the surface of the LaNiO$_3$ layer (the first electrode 13), by the identical method to that of the example 1.

The intensity of the (001) reflection peak according to the example 8 was a very strong value of 6,734 cps. FIG. 14 shows the measurement result of the electric field—the amount of the deformation. The $d_{31}$ (40 kV/cm) of the piezoelectric film according to the example 8 was a high piezoelectric constant of −77 pC/N. The ratio of $d_{31}$ (40 kV/cm)/$d_{31}$ (80 kV/cm) was 1.18. This means that the amount of the deformation was proportional to the applied electric field.

Example 9

An identical experiment to that of the example 1 was performed except that the MgO substrate was substituted with a laminate composed of a (100) NiO layer and a stainless-steel substrate. The piezoelectric film according to the example 9 was formed as below.

A NiO layer having NaCl type structure oriented to a (001) surface orientation was formed on the metal plate made of stainless-steel by a plasma MOCVD method. As a raw material gas, nickel acetylacetonate was used, the NiO layer with a thickness of 400 nanometers was formed at the RF power of 100 W under the substrate temperature of 400 degrees Celsius.

Subsequently, a Pt layer oriented to a (001) surface orientation with a thickness of 250 nanometers was formed by sputtering. As a target, a metallic Pt was used. The Pt layer was formed in an Ar gas atmosphere at the RF power of 15 W under the substrate temperature of 400 degrees Celsius.

Next, a (1-z)(Na$_x$Bi$_y$)TiO$_{0.5x+1.5y+2}$-zBaTiO$_3$ layer having composition around the Morphotropic Phase Boundary (x=0.37, y=0.58, and z=0.07), with a thickness of 2.7 micrometers was formed on the LiNiO$_3$ layer (the first electrode) 13, by the same method as that of the example 1.

The intensity of the (001) reflection peak according to the example 9 was a very strong value of 32,105 cps. FIG. 14 shows the measurement result of the electric field—the amount of the deformation. The $d_{31}$ (40 kV/cm) of the piezoelectric film according to the example 9 was a high piezoelectric constant of −89 pC/N. The ratio of $d_{31}$ (40 kV/cm)/$d_{31}$ (80 kV/cm) was 1.14. This means that the amount of the deformation was proportional to the applied electric field.

Comparative Example 1

An identical experiment to that of the example 1 was performed except for x=0.5, y=0.5 and z=0.07.

In the comparative example 1, the reflection peak derived from the (001)-oriented $(1-z)(Na_xBi_y)TiO_{0.5x+1.5y+2}$-$zBaTiO_3$ layer was observed. However, a plurality of reflection peaks derived from other crystalline orientation in the $(1-z)(Na_xBi_y)TiO_{0.5x+1.5y+2}$-$zBaTiO_3$ layer was also observed. The intensity of the above (001) reflection peak was 30,893 cps, which was much lower than the peak intensity (256,075 cps) in the example 1. This means that the $(1-z)(Na_xBi_y)TiO_{0.5x+1.5y+2}$-$zBaTiO_3$ layer in the comparative example 1 has a lower degree of orientation than the $(1-z)(Na_xBi_y)TiO_{0.5x+1.5y+2}$-$zBaTiO_3$ layer in the example 1.

The half value width of the above (001) reflection peak was 0.86°, which was greater than the widths in the example 1. This means that the $(1-z)(Na_xBi_y)TiO_{0.5x+1.5y+2}$-$zBaTiO_3$ layer in the comparative example 1 has a lower degree of orientation than the $(1-z)(Na_xBi_y)TiO_{0.5x+1.5y+2}$-$zBaTiO_3$ layer in the examples.

Next, an Au layer with a thickness of 100 nanometers was formed by vapor deposition on the surface of the $(1-z)(Na_xBi_y)TiO_{0.5x+1.5y+2}$-$zBaTiO_3$ layer so as to obtain a piezoelectric film according to the comparative example 1.

The ferroelectric properties and piezoelectric performance of this piezoelectric film were evaluated with use of the Pt layer and the Au layer included in the piezoelectric film. However, a leak current in the piezoelectric film was very great, and it was difficult to measure a hysteresis loop. Since the piezoelectric film according to the comparative example 1 was such a great leak current property, it was difficult to measure an exact value of the piezoelectric constant $d_{31}$ of the piezoelectric film according to the comparative example 1. The presumptive piezoelectric constant $d_{31}$ at the applied electric field of 40 kV/cm was a much smaller value of −44 pC/N than the value of −144 pC/N in the example 1. At the applied electric field of 80 kV/cm, the leak current was too large to measure the amount of the deformation.

Comparative Example 2

An identical experiment to that of the example 1 was performed except for x=0.28, y=0.58, and z=0.07.

The (001) reflection peak intensity according to the comparative example 2 was a very small value of 30,229 cps. FIG. 12 shows the measurement result of the electric field—the amount of the deformation. The piezoelectric constant $d_{31}$ at the applied electric field of 40 kV/cm was a much smaller value of −94 pC/N than the value of −144 pC/N of the example 1. The ratio of $d_{31}$ (40 kV/cm)/$d_{31}$ (80 kV/cm) was 1.22. This means that the amount of the deformation of the piezoelectric film according to the comparative example 2 was non-linear with regard to the applied electric field. The piezoelectric film according to the comparative example 2 had a lower deformation property.

Comparative Example 3

An identical experiment to that of the example 1 was performed except for x=0.48, y=0.59, and z=0.07.

The (001) reflection peak intensity according to the comparative example 3 was a very small value of 26,212 cps. FIG. 12 shows the measurement result of the electric field—the amount of the deformation. The piezoelectric constant $d_{31}$ at the applied electric field of 40 kV/cm was a much smaller value of −84 pC/N than the value of −144 pC/N of the example 1. The ratio of $d_{31}$ (40 kV/cm)/$d_{31}$ (80 kV/cm) was 1.33. This means that the amount of the deformation of the piezoelectric film according to the comparative example 3 was non-linear with regard to the applied electric field. The piezoelectric film according to the comparative example 3 had a lower deformation property.

Comparative Example 4

An identical experiment to that of the example 1 was performed except for x=0.36, y=0.50, and z=0.07.

The (001) reflection peak intensity according to the comparative example 4 was a very small value of 22,660 cps. FIG. 12 shows the measurement result of the electric field—the amount of the deformation. The piezoelectric constant $d_{31}$ at the applied electric field of 40 kV/cm was a much smaller value of −79 pC/N than the value of −144 pC/N of the example 1. The ratio of $d_{31}$ (40 kV/cm)/$d_{31}$ (80 kV/cm) was 1.31. This means that the amount of the deformation of the piezoelectric film according to the comparative example 4 was non-linear with regard to the applied electric field. The piezoelectric film according to the comparative example 4 had a lower deformation property.

Comparative Example 5

An identical experiment to that of the example 1 was performed except for x=0.40, y=0.65, and z=0.07.

The (001) reflection peak intensity according to the comparative example 5 was a very small value of 28,454 cps. FIG. 13 shows the measurement result of the electric field—the amount of the deformation. The piezoelectric constant $d_{31}$ at the applied electric field of 40 kV/cm was a much smaller value of −84 pC/N than the value of −144 pC/N of the example 1. The ratio of $d_{31}$ (40 kV/cm)/$d_{31}$ (80 kV/cm) was 1.21. This means that the amount of the deformation of the piezoelectric film according to the comparative example 5 was non-linear with regard to the applied electric field. The piezoelectric film according to the comparative example 5 had a lower deformation property.

Comparative Example 6

An identical experiment to that of the example 1 was performed except for x=0.29, y=0.43, and z=0.06. The piezoelectric film according to the comparative example 6 is substantially identical to the piezoelectric film represented by "BNT_08 7" disclosed in Table 1 of Patent Literature 2 except that the compositions of Bi and Na are different.

The reflection peak according to the comparative example 6 reveals that the $(1-z)(Na_xBi_y)TiO_{0.5x+1.5y+2}$-$zBaTiO_3$ layer 15 is oriented only to a (001) orientation. However, the peak intensity thereof was no more than 24,823 cps, which was one-tenth times greater than that of the example 1. FIG. 14 shows the measurement result of the electric field—the amount of the deformation. Note that the line in FIG. 14 was drawn by connecting the original point with the dot of the amount of the deformation at the applied electric field of 40 kV/cm, similar to the dashed line of FIG. 12. The piezoelectric constant $d_{31}$ (40 kV/cm) was a much smaller value of −73 pC/N than the value of −144 pC/N in the example 1. The linearity of the piezoelectric constant shows that the ratio of $d_{31}$ (40 kV/cm)/$d_{31}$ (80 kV/cm) was 1.40. In FIG. 14, the dot indicating the amount of the deformation at the applied electric field of 80 kV/cm is far from the line drawn by connecting the original point and the dot of the amount of the deformation at the applied electric field of 40 kV/cm. This means that the amount of the deformation of the piezoelectric film according to the comparative example 6 was non-linear with regard to the applied electric field. The piezoelectric film according to the comparative example 6 had a lower deformation property.

Comparative Example 7

An identical experiment to that of the example 8 was performed except for x=0.5, y=0.5, and z=0.07.

The (001) reflection peak intensity according to the comparative example 7 was a very small value of 1,291 cps. Furthermore, the observed reflection peak included not only the reflection peak of the $(1-z)(Na_xBi_y)TiO_{0.5x+1.5y+2}$-$zBaTiO_3$ layer oriented to a (001) surface orientation, but other plural reflection peaks. Since a high piezoelectric constant was not expected in a case where the piezoelectric film failed to be oriented to a single orientation, the piezoelectric property was not measured.

Comparative Example 8

An identical experiment to that of the example 9 was performed except for x=0.5, y=0.5, and z=0.07.

The (001) reflection peak intensity according to the comparative example 8 was a very small value of 3,318 cps. Furthermore, the observed reflection peak included not only the reflection peak of the $(1-z)(Na_xBi_y)TiO_{0.5x+1.5y+2}$-$zBaTiO_3$ layer oriented to a (001) surface orientation, but other plural reflection peaks. Since a high piezoelectric constant was not expected in a case where the piezoelectric film failed to be oriented to a single orientation, the piezoelectric property was not measured.

The following Table 1 and Table 2 summarize the evaluation results of the examples 1-9 and the comparative examples 1-8.

TABLE 1

| | Base substrate | Electrode structure | Composition of piezoelectric layer | | | |
|---|---|---|---|---|---|---|
| | | | Na(x) | Bi(y) | Ba(z) | Additive |
| Comparative example 1 | MgO(100) | Pt(001) | 0.50 | 0.50 | 0.07 | — |
| Comparative example 2 | MgO(100) | Pt(001) | 0.28 | 0.58 | 0.07 | — |
| Example 2 | MgO(100) | Pt(001) | 0.30 | 0.56 | 0.07 | — |
| Example 1 | MgO(100) | Pt(001) | 0.37 | 0.58 | 0.07 | — |
| Example 3 | MgO(100) | Pt(001) | 0.46 | 0.55 | 0.07 | — |
| Comparative example 3 | MgO(100) | Pt(001) | 0.48 | 0.59 | 0.07 | — |
| Comparative example 4 | MgO(100) | Pt(001) | 0.36 | 0.50 | 0.07 | — |
| Example 4 | MgO(100) | Pt(001) | 0.38 | 0.51 | 0.07 | — |
| Example 1 | MgO(100) | Pt(001) | 0.37 | 0.58 | 0.07 | — |
| Example 5 | MgO(100) | Pt(001) | 0.39 | 0.62 | 0.07 | — |
| Comparative example 5 | MgO(100) | Pt(001) | 0.40 | 0.65 | 0.07 | — |
| Comparative example 6 | MgO(100) | Pt(001) | 0.29 | 0.43 | 0.06 | — |
| Example 6 | MgO(100) | Pt(001) | 0.36 | 0.58 | 0.07 | Mn |
| Example 7 | MgO(100) | Pt(001) | 0.38 | 0.56 | 0.09 | — |
| Comparative example 7 | Stainless | Pt(111)/LaNiO3(001) | 0.50 | 0.50 | 0.07 | — |
| Example 8 | Stainless | Pt(111)/LaNiO3(001) | 0.37 | 0.58 | 0.07 | — |
| Comparative example 8 | NiO(001)/Stainless | Pt(001) | 0.50 | 0.50 | 0.07 | — |
| Example 9 | NiO(001)/Stainless | Pt(001) | 0.37 | 0.58 | 0.07 | — |

TABLE 2

| | Crystal orientaion of piezoelectric layer | | | piezoelectric performance | | |
|---|---|---|---|---|---|---|
| | Orientaion direction | (001) peak intensity | Effect | $d_{31}$ | lenearity $d_{31}$(40 kV/cm)/$d_{31}$(80 kV/cm) | Effect |
| Comparative example 1 | (001) and other peaks | 30,893 cps | Poor | −44 pC/N | x | — |
| Comparative example 2 | (001) | 30,229 cps | Poor | −94 pC/N | 1.22 (non linear) | Poor |
| Example 2 | (001) | 139,961 cps | Good | −117 pC/N | 1.08 (lenear) | Good |
| Example 1 | (001) | 256,075 cps | Excellent | −144 pC/N | 1.03 (lenear) | Excellent |
| Example 3 | (001) | 106,869 cps | Good | −101 pC/N | 1.15 (linear) | Good |
| Comparative example 3 | (001) | 26,212 cps | Poor | −84 pC/N | 1.33 (non linear) | Poor |
| Comparative example 4 | (001) | 22,660 cps | Poor | −79 pC/N | 1.31 (non linear) | Poor |
| Example 4 | (001) | 76,040 cps | Good | −104 pC/N | 1.09 (linear) | Good |
| Example 1 | (001) | 256,075 cps | Excellent | −144 pC/N | 1.03 (linear) | Excellent |
| Example 5 | (001) | 143,377 cps | Good | −119 pC/N | 1.06 (linear) | Good |
| Comparative example 5 | (001) | 28,454 cps | Poor | −84 pC/N | 1.21 (non linear) | Poor |
| Comparative example 6 | (001) | 24,071 cps | Poor | −73 pC/N | 1.40 (non linear) | Poor |
| Example 6 | (001) | 214,498 cps | Good | −195 pC/N | 1.04 (linear) | Excellent |
| Example 7 | (001) | 194,874 cps | Good | −118 pC/N | 1.11 (linear) | Good |
| Comparative example 7 | (001) and other peaks | 1,291 cps | Poor | — | — | — |
| Example 8 | (001) | 6,734 cps | Good | −77 pC/N | 1.18 (linear) | Good |
| Comparative example 8 | (001) and other peaks | 3,318 cps | poor | — | — | — |
| Example 9 | (001) | 32,105 cps | Good | −89 pC/N | 1.14 (linear) | Good |

As shown in Table 1 and Table 2, the $(Na_xBi_y)TiO_{0.5x+1.5y+2}$—$BaTiO_3$ layer ($0.30 \leq x \leq 0.46$, $0.51 \leq y \leq 0.62$, and $0.07 \leq z \leq 0.09$) formed on the electrode layer having a (001) orientation had a high (001) orientation and a high crystallinity. Furthermore, the piezoelectric constant was high, and the amount of the deformation was proportional to the electric field.

The examples 1, 2 and 3 and the comparative examples 2 and 3 mean that the $(1-z)(Na_xBi_y)TiO_{0.5x+1.5y+2}$-$zBaTiO_3$ layer has a high (001) crystalline orientation, a low dielectric loss, a high piezoelectric constant, and a high linearity of the electric field—the amount of the deformation, when the value of x, which represents the amount of Na in the $(1-z)(Na_xBi_y)TiO_{0.5x+1.5y+2}$-$zBaTiO_3$ layer, is not less than 0.30 and not more than 0.46.

The example 3 and the comparative example 3 mean that x must not be over 0.46.

The example 2 and the comparative example 2 mean that x must not be less than 0.30.

The examples 1, 4 and 5 and the comparative examples 4 and 5 mean that the $(1-z)(Na_xBi_y)TiO_{0.5x+1.5y+2}$-$zBaTiO_3$ layer has a high (001) crystalline orientation, a low dielectric loss, a high piezoelectric constant, and a high linearity of the electric field—the amount of the deformation, when the value of y, which represents the amount of Bi in the $(1-z)(Na_xBi_y)TiO_{0.5x+1.5y+2}$-$zBaTiO_3$ layer, is not less than 0.51 and not more than 0.62.

The example 5 and the comparative example 5 mean that y must not be over 0.62.

The example 4 and the comparative example 4 mean that y must not be less than 0.51.

The example 6 means that the addition of manganese improves the piezoelectric constant of the (Bi, Na, Ba)TiO$_3$ layer.

The example 7 means that the same effect as that of the example 1 was obtained when z=0.09.

The example 8 means that a stainless-steel substrate can be used instead of the MgO substrate as a base substrate and that a LaNiO$_3$ layer can be used as the first electrode.

The example 9 means that a laminate composed of a NiO (001) layer and a stainless-steel substrate can be used instead of the MgO substrate as a base substrate.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The $(1-z)(Na_xBi_y)TiO_{0.5x+1.5y+2}$-$zBaTiO_3$ layer 15 ($0.30 \leq x \leq 0.46$, $0.51 \leq y \leq 0.62$, and $0.07 \leq z \leq 0.09$) had a high (001) crystalline orientation, a low dielectric loss, a high piezoelectric constant, and a high linearity of the electric field—the amount of the deformation. The piezoelectric film according to the present invention is useful as a piezoelectric film alternative to a conventional lead-containing oxide ferroelectrics, due to the high piezoelectric constant and the high linear deformation behavior. The piezoelectric film of the present invention can be used suitably for applications such as pyroelectric sensors and piezoelectric devices in which piezoelectric films are used. Examples of such applications are the ink jet head, angular velocity sensor and piezoelectric generating element of the present invention.

The ink jet head of the present invention has excellent ink ejection characteristics although it does not contain a lead-containing ferroelectric material such as PZT. The method of forming an image by this ink jet head has high image forming accuracy and high expressivity. The angular velocity sensor of the present invention has high sensor sensitivity although it does not contain a lead-containing ferroelectric material such as PZT. The method of measuring an angular velocity by this angular velocity sensor has excellent measurement sensitivity. The piezoelectric generating element of the present invention has excellent electric power generation characteristics although it does not contain a lead-containing ferroelectric material such as PZT. The electric power generation method of the present invention using this piezoelectric generating element has high electric power generation efficiency.

REFERENCE MARKS IN THE DRAWINGS 11 substrate
12 metal electrode layer
13 first electrode
15 $(1-z)(Na_xBi_y)TiO_{0.5x+1.5y+2}$-$zBaTiO_3$ layer
17 second electrode
101 through-holes
102 pressure chambers
102a walls
102b walls
103 individual electrode layer
104 piezoelectric film
105 common liquid chambers
106 supply port
107 ink passage
108 nozzle hole
111 vibration layer
112 common electrode layer
113 intermediate layer
114 adhesive
120 base substrate
130 Si substrate
200 substrate
200a stationary part
200b vibration part
202 first electrode
205 second electrode
206 drive electrode
206a connection terminal
207 sense electrode
207a connection terminal
208 piezoelectric film
300 substrate
300a stationary part
300b vibration part
302 first electrode
305 second electrode
306 weight load

The invention claimed is:

1. A method of measuring an angular velocity using an angular velocity sensor, the method comprising:
a step of preparing the angular velocity sensor, wherein:
the angular velocity sensor comprises a substrate having a vibration part, a piezoelectric film bonded to the vibration part, and an electrode group,
the electrode group comprises a drive electrode and a sense electrode,
the piezoelectric film comprises a piezoelectric layer and first and second electrodes which sandwich the piezoelectric layer therebetween, the first electrode has a (001) orientation,
the piezoelectric layer is composed of $(1-z)(Na_xBi_y)TiO_{0.5x+1.5y+2}$-$zBaTiO_3$ having a (001) orientation,
x is not less than 0.30 and not more than 0.46,
y is not less than 0.51 and not more than 0.62,
z is not less than 0.07 and not more than 0.09, and
the electrode group comprises one electrode of the first and second electrodes,
a step of applying a driving voltage having an applied electric field of not less than 40 kV/cm and not more than 80 kV/cm to the piezoelectric layer through another electrode of the first and second electrodes and the driving electrode to oscillate the vibration part; and
a step of measuring, through the another electrode and the sense electrode, a deformation of the vibration part caused by an angular velocity applied to the oscillating vibration part to obtain a value of the applied angular velocity.

2. An angular velocity sensor comprising:
a substrate having a vibration part;
a piezoelectric film bonded to the vibration part; and
an electrode group, wherein:
the electrode group comprises a drive electrode and a sense electrode,
the piezoelectric film comprises a piezoelectric layer and first and second electrodes which sandwich the piezoelectric layer therebetween,
the first electrode has a (001) orientation,
the piezoelectric layer is composed of $(1-z)(Na_xBi_y)TiO_{0.5x+1.5y+2}$-$zBaTiO_3$ having a (001) orientation,
x is not less than 0.30 and not more than 0.46,
y is not less than 0.51 and not more than 0.62,
z is not less than 0.07 and not more than 0.09, and
the electrode group comprises one electrode of the first and second electrodes.

3. A method of forming an image by an ink jet head, the method comprising:
a step of preparing the ink jet head, wherein:
the ink jet head comprises:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded,
the vibration layer is bonded to the piezoelectric film so that the vibration layer is displaceable in its film thickness direction according to a deformation of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode has a (001) orientation,
the piezoelectric layer is composed of $(1-z)(Na_xBi_y)TiO_{0.5x+1.5y+2}$-$zBaTiO_3$ having a (001) orientation,
x is not less than 0.30 and not more than 0.46,
y is not less than 0.51 and not more than 0.62,
z is not less than 0.07 and not more than 0.09; and
a step of applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

4. An ink jet head comprising:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded, wherein:
the vibration layer is bonded to the piezoelectric film so that the vibration layer is displaceable in its film thickness direction according to a deformation of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode has a (001) orientation,
the piezoelectric layer is composed of $(1-z)(Na_xBi_y)TiO_{0.5x+1.5y+2}$-$zBaTiO_3$ having a (001) orientation,
x is not less than 0.30 and not more than 0.46,
y is not less than 0.51 and not more than 0.62, and
z is not less than 0.07 and not more than 0.09.

5. A method of generating electric power using a piezoelectric power-generating element, the method comprising:
a step of preparing the piezoelectric generating element, wherein:
the piezoelectric generating element comprises:
a substrate having a vibration part; and
a piezoelectric film bonded to the vibration part and having a piezoelectric layer sandwiched between a first electrode and a second electrode,
the first electrode has a (001) orientation,
the piezoelectric layer is composed of $(1-z)(Na_xBi_y)TiO_{0.5x+1.5y+2}$-$zBaTiO_3$ having a (001) orientation,
x is not less than 0.30 and not more than 0.46,
y is not less than 0.51 and not more than 0.62, and
z is not less than 0.07 and not more than 0.09; and
a step of vibrating the vibration part to obtain electric power through the first electrode and the second electrode.

6. A piezoelectric element comprising:
a substrate having a vibration part; and
a piezoelectric film bonded to the vibration part and having a piezoelectric layer sandwiched between a first electrode and a second electrode, wherein:
the first electrode has a (001) orientation,
the piezoelectric layer is composed of $(1-z)(Na_xBi_y)TiO_{0.5x+1.5y+2}$-$zBaTiO_3$ having a (001) orientation,
x is not less than 0.30 and not more than 0.46,
y is not less than 0.51 and not more than 0.62, and
z is not less than 0.07 and not more than 0.09.

* * * * *